United States Patent
Rost et al.

(10) Patent No.: US 6,815,970 B2
(45) Date of Patent: Nov. 9, 2004

(54) METHOD FOR MEASURING NBTI DEGRADATION EFFECTS ON INTEGRATED CIRCUITS

(75) Inventors: Timothy A. Rost, Plano, TX (US); Vijay Reddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/225,934

(22) Filed: Aug. 22, 2002

(65) Prior Publication Data

US 2003/0042926 A1 Mar. 6, 2003

Related U.S. Application Data

(60) Provisional application No. 60/316,523, filed on Aug. 31, 2001.

(51) Int. Cl.[7] .............................................. G01R 31/26
(52) U.S. Cl. .......................... 324/765; 324/769; 438/17
(58) Field of Search ................................ 324/73.1, 763, 324/765, 767–769, 158.1; 438/14, 17–18; 257/48, 66, 368–369; 327/264, 272, 276, 278, 581

(56) References Cited

U.S. PATENT DOCUMENTS

| | | | |
|---|---|---|---|
| 5,596,218 A | | 1/1997 | Soleimani et al. |
| 5,625,288 A | * | 4/1997 | Snyder et al. ........... 324/158.1 |
| 6,144,214 A | | 11/2000 | Athan |
| 6,456,104 B1 | * | 9/2002 | Guarin et al. ............... 324/769 |
| 6,476,632 B1 | * | 11/2002 | La Rosa et al. ............ 324/769 |
| 6,521,469 B1 | * | 2/2003 | La Rosa et al. .............. 438/17 |

OTHER PUBLICATIONS

Vincent, E., "A Procedure for Measuring P–Channel MOSFET Negative BIAS Temperature Instabilities," STMicroelectronics, Oct. 2000, 13 pages.

* cited by examiner

Primary Examiner—Minh N. Tang
(74) Attorney, Agent, or Firm—Peter K. McLarty; W. James Brady, III; Frederick J. Telecky, Jr.

(57) ABSTRACT

A method of testing integrated circuits for the effect of NBTI degradation. A static DC stress voltage is applied to the voltage supply input of the circuit. This circuit is held at this voltage for a given stress period. The application of the DC voltage is equivalent to applying a negative gate bias, and isolates the effects of NBTI degradation from CHC (channel hot carrier) degradation or other degradation that occurs when the circuit has a clocked input.

15 Claims, 3 Drawing Sheets

US 6,815,970 B2

METHOD FOR MEASURING NBTI DEGRADATION EFFECTS ON INTEGRATED CIRCUITS

This application claims priority under 35 USC § 119(e)(1) of provisional application Ser. No. 60/316,523, filed Aug. 31, 2001.

TECHNICAL FIELD OF THE INVENTION

This invention relates to integrated circuits, and more particularly to a method of measuring the effects of negative bias temperature instability (NBTI).

BACKGROUND OF THE INVENTION

Recent advances in advanced submicron CMOS technologies have been accompanied by various reliability phenomena. One such phenomena is referred to as negative bias temperature instability (NBTI), and has an impact on lifetime reliability of MOSFET devices. As oxides are further scaled, unchecked NBTI could become a dominant failure mechanism.

The "instability" in NBTI refers to parameter drift observed in a PMOS transistor when a negative bias is applied to the gate of the transistor. The resulting instability is evidenced by a decrease in the saturation drive current, Idsat, and an increase in the magnitude of the threshold voltage, Vt. Equivalently, a parameter shift occurs when the gate is grounded and a positive bias exists on the source/drain and well, such as in a CMOS inverter circuit.

SUMMARY OF THE INVENTION

One aspect of the invention is a method of testing an integrated circuit to determine the effect of negative bias temperature instability (NBTI). A DC stress voltage is applied at the voltage supply input of the circuit, the DC stress voltage being appropriate for inducing NBTI degradation on transistors within the circuit. All circuit inputs and outputs are set at a known voltage, by being grounded or at a stress voltage. The circuit is held at the DC stress voltage for a DC stress period. After the DC stress period, measurements of at least one electrical parameter of the circuit, such as its minimum operating voltage, are taken. This cycle of stressing and measuring the circuit may be repeated for as many iterations are desired to provide an indication of circuit reliability.

An advantage of the invention is that it provides an easy test at the product or circuit level. It permits convenient assessment of the impact of NBTI on product or circuit performance. As a result of the static (non clocked) input NBTI effects are isolated from the effects of CHC (channel hot carrier) or other degradation that occurs when the circuit is in a dynamic operating mode.

DETAILED DESCRIPTION OF THE INVENTION

Figure 1:
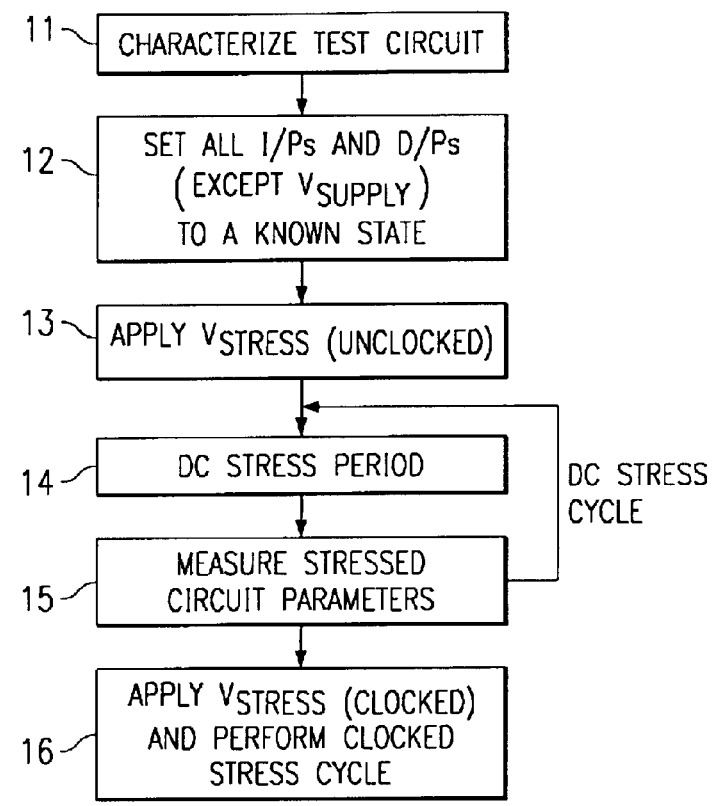
FIG. 1 illustrates a method of testing a circuit for NBTI effects in accordance with the invention.

FIG. 1 illustrates a method of testing an integrated circuit in accordance with the invention. As indicated, the method begins at Step 11 with selection and parameter characterization of a circuit to be tested. In Step 12, all circuit inputs and outputs other than the power supply voltage input are grounded. In Step 13, a high (stress level) voltage supply is applied to the circuit. Step 14 indicates the beginning of a stress period, after which Step 15 is performed to provide parameter measurements. In other words, during each stress cycle, the circuit is stressed then measured, and this cycle is repeated for as many iterations as desired for a complete NBTI stress test.

As explained below, the application of a static DC stress input permits only NBTI effects of the circuit to be accelerated by stress. Examples of circuit parameters of interest are the minimum operating voltage, Vmin, and maximum output frequency, Fmax.

Step 16 is an additional step that may be performed to determine the combined effects of NBTI and other circuit degradation, such as CHC (channel hot carrier) effects. A clocked input is applied and the circuit is stressed over time while additional parameters measurements are made.

During both the DC (static) stress cycle and the clocked (dynamic) cycle, the circuit may be subjected to stress-inducing heat levels. As explained below, NBTI is both time and heat dependent, with the effects of NBTI being greater with increases in time and temperature.

Figure 2A:
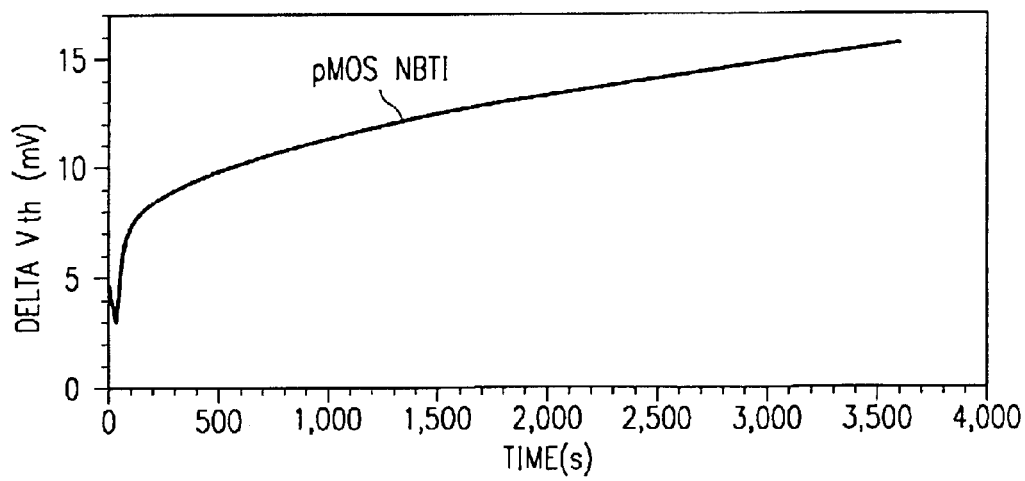
FIG. 2A illustrates the time evolution of transistor threshold voltage during NBTI stress.

FIG. 2A illustrates the time evolution of linear threshold voltage, Vth, drift during NBTI stress. With delta Vth versus time on a linear scale, the curve indicates a rapid increase during early stress, then a saturating behavior for longer stress times. In FIG. 2A, Vg=−1.85 volts, Vd=Vs=Vwell=0 volts. The absolute value for Vg is larger than the voltage at which the device would normally be operated. In the example of FIG. 2A, the device is a 1.2 volt PMOS device.

For applying NBTI stress, the temperature was held at 105 degrees centigrade for 1 hour. In accordance with standard test procedures, for each stress cycle, the device is stressed and then the device parameters are measured. Then, the device is stressed again, measured again, etc. In other words, the stressing is periodically interrupted and measurements are taken.

Figure 2B:
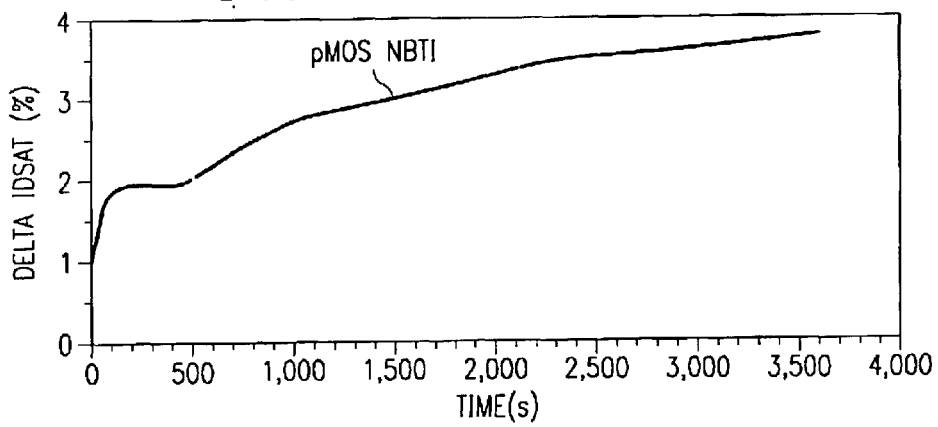
FIG. 2B illustrates the time evolution of transistor drain current during NBTI stress.

FIG. 2B illustrates a similar effect for the saturation drain current, Idsat. The stress conditions are the same as those discussed above for Vth.

The NBTI mechanism can be described as an interaction of several factors. For example, NBTI stress worsens as the stress voltage increases. Examples of other factors affecting sensitivity to NBTI stress are temperature and the other conditions of the circuit's environment.

Figure 3:
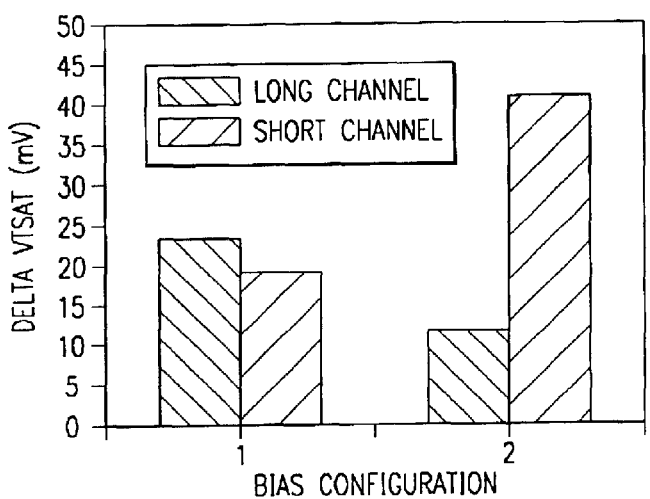
FIG. 3 illustrates the effect of different bias configurations on transistor NBTI and CHC degradation.

FIG. 3 illustrates the effect on NBTI and CHC (channel hot carrier) degradation from applying different biases. Two different bias configurations are illustrated, for both short channel and long channel transistors. The long channel transistor has a width-to-length ratio of 10/5; the short channel transistor has a width-to-length ratio of 10/0.135.

In the first configuration, Vg=−1.9 volts, and Vd=Vs=Vnwell=0 volts. This configuration illustrates how the NBTI effect is substantially independent of channel length.

In the second configuration, Vg=−1.9 volts, Vs=−1.9 volts, and Vd=Vnwell=0 volts. In other words, the device is turned "on". As compared to the first configuration, the second configuration provides a current through the channel. In this second configuration, the transistor is affected by both NBTI and CHC (channel hot carrier) effects.

In the device examples of this description, and in particular, for deep submicron devices, both NBTI and CHC tend to raise Vt. Further, it is known that CHC degradation has substantially more effect on short channel devices than on long channel devices. Thus, by comparing the two configurations of FIG. 3, it is possible to isolate the effects of NBTI from CHC.

The concepts illustrated in FIG. 3 can be extended to circuit level testing. By applying a static DC stress, it is possible to accelerate only NBTI effects.

For purposes of example, a CMOS ring oscillator circuit may be used to illustrate the effect of NBTI induced transistor degradation on circuit performance. For the example of this description, an 11 stage inverter ring oscillator was used, having an oscillator frequency of approximately 1 Ghz at a supply voltage, Vdd, of 1.5 volts. This signal is frequency divided by a factor of 32 and fed through an output buffer. In normal (pre-stress) operation, the oscillation frequency is dependent on the supply voltage, Vdd.

Figure 4:
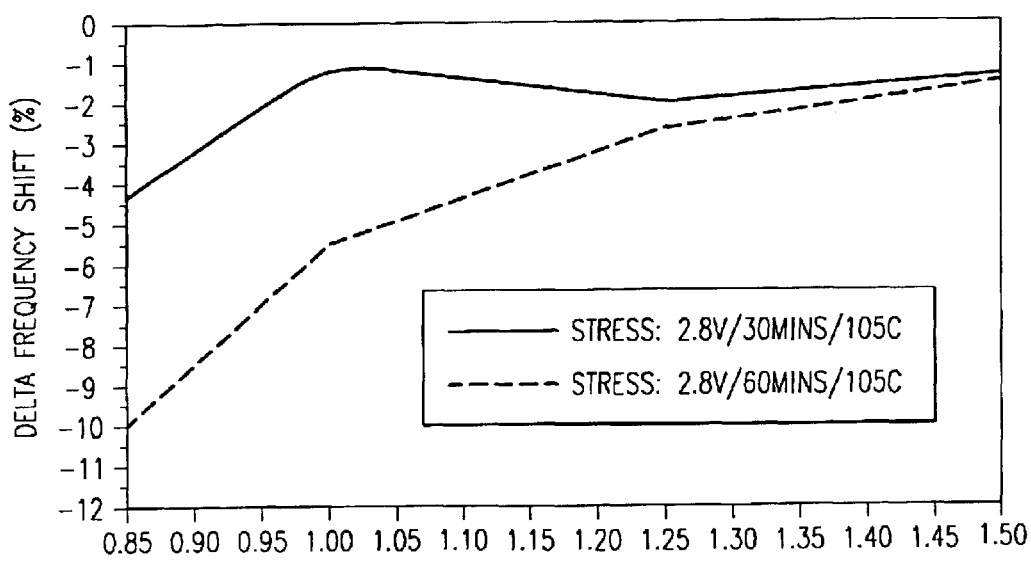
FIG. 4 illustrates two post-stressed and one pre-stressed output frequency shifts of a ring oscillator.

FIG. 4 illustrates two-post stressed and a pre-stressed output frequency shifts of a ring oscillator. In one test, the oscillator was stressed at thirty and sixty minute periods at 2.8 volts and 105 degrees centigrade. The stress characterization was performed by measuring the frequency of the output waveform at supply voltages, Vdd, of 0.85 volts, 1.0 volts, 1.25 volts, and 1.50 volts, respectively.

As illustrated in FIG. 4, the magnitude of the negative frequency shift increases as the supply voltage decreases. Further, increasing the stress time results in larger degradation. In fact, a 10% frequency decrease is observed at Vdd=0.85 volts after a sixty minute stress at 2.8 volts and 105 degrees centigrade. The roll-off in frequency shift is more pronounced at lower voltages. At Vdd=1.5 volts, very little difference is observed between the thirty and sixty minute stresses.

Figure 5:
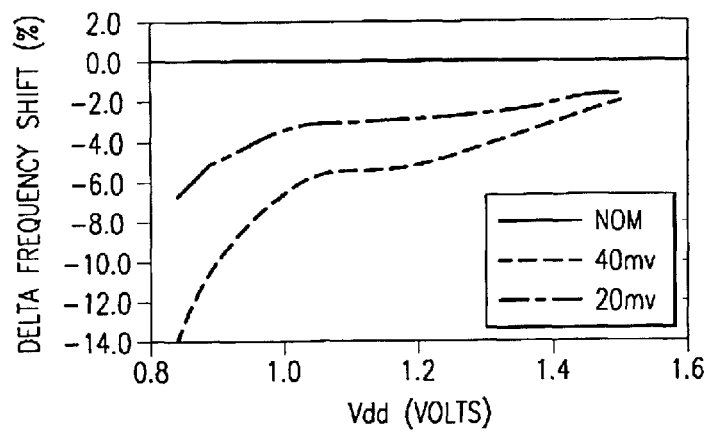
FIG. 5 illustrates the results of simulated NBTI stress testing.

FIG. 5 illustrates simulated stress testing at the transistor level. A SPICE simulation was performed with transistor models that shifted the VTHO by 20 mvolts and 40 mvolts at 105 degrees centigrade. Because oscillation frequency is dependent on the supply voltage, Vdd, the plot of the frequency shift versus supply voltage clearly illustrates the relative degradation. A nominal (unstressed) condition is also shown.

Given the NBTI stress characterizations of FIGS. 4 and 5, it can be inferred that the large sensitivity in frequency degradation at lower supply voltages is primarily due to two reasons. First, there is reduced voltage headroom for operation as Vdd is decreased. Second, there is larger transistor degradation as Vdd is decreased. These two effects combine to result in more circuit sensitivity to NBTI degradation at lower operating voltages.

Figure 6:
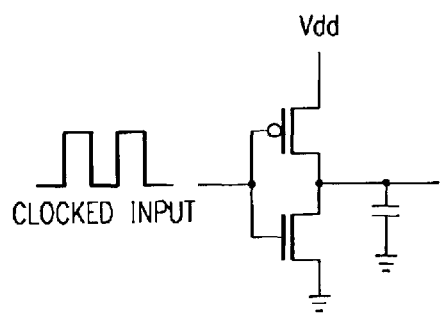
FIG. 6 illustrates how a circuit may be tested for both NBTI and CHC degradation.
Figure 7:
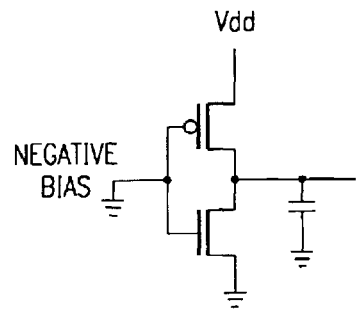
FIG. 7 illustrates how a circuit may be tested for only NBTI degradation.

FIGS. 6 and 7 illustrate how a CMOS circuit may be tested so as to isolate the effect of NBTI degradation. In FIG. 6, the circuit is stressed with a clocked input (dynamic stress). The supply voltage, Vdd, is held at a desired stress voltage, and the gates switch between ground and Vdd. The resulting output characteristics represent a combination of NMOS PBTI (positive bias temperature instability), PMOS NBTI and CHC. In FIG. 7, the supply voltage, Vdd, is unclocked. As a result, the circuit is stressed with only a DC input (static stress). The gate is grounded and a positive bias is applied to the well, to create NBTI conditions. The resulting output characteristics represent circuit degradation from PMOS NBTI only.

The NBTI shift in Vt of a device is related to a shift in the minimum operating voltage, Vmin, of a circuit. Specifically, the increase in Vt that results from NBTI stress erodes the circuit margin. As a result, a higher voltage is required to maintain the same operating performance. Because of this relationship, and because Vmin is a commonly used product level testing parameter, the NBTI stress testing described herein can be used as an indicator of product reliability.

Figure 8:
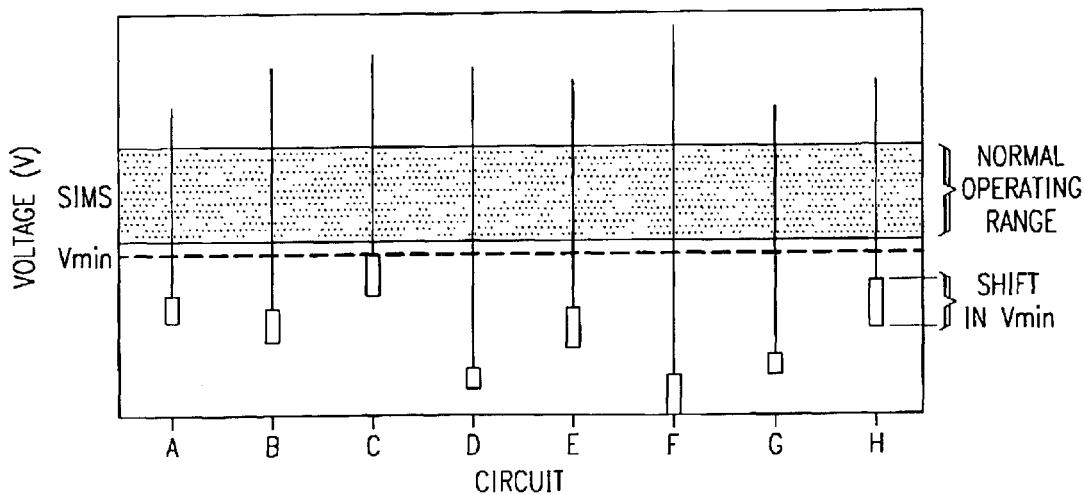
FIG. 8 illustrates how a circuit may be tested for the effects of NBTI on minimum operating voltage.

FIG. 8 illustrates how a device may be easily tested for NBTI effects. In the example of FIG. 8, a device has been partitioned, for testing purposes, into eight circuits, A–H. Each circuit has a range of operating voltages, indicated by the vertical bar associated with the circuit. The lower end of each bar represents the minimum operating voltage. The horizontal shaded area represents a range of acceptable operating voltages. The thickened area at the end of each bar represents a shift in the minimum operating voltage as caused by NBTI when the circuit is stressed with a static DC voltage. In this manner, it can be determined whether the shift in minimum operating voltage causes the circuit to fail to meet specifications for a predetermined operating range.

Other Embodiments

Although the present invention has been described in detail, it should be understood that various changes, substitutions, and alterations can be made hereto without departing from the spirit and scope of the invention as defined by the appended claims.

What is claimed is:

1. A method of testing an integrated circuit to determine the effect of negative bias temperature instability (NBTI), comprising the steps of:

applying a DC stress voltage at the voltage supply input of the circuit, the DC stress voltage being appropriate for inducing NBTI within the circuit;

holding all other circuit inputs and outputs at either ground or the DC stress voltage;

maintaining the DC stress voltage for a DC stress period; and after the DC stress period, taking measurements of at least one electrical parameter of the circuit.

2. The method of claim 1, further comprising the step of applying heat to the circuit during the DC stress period.

3. The method of claim 1, further comprising the step of removing the DC stress voltage after the maintaining and measuring steps, and applying a clocked stress voltage to the circuit during a clocked stress period.

4. The method of claim 3, further comprising the step of isolating the effects of NBTI from the effects of channel hot carrier (CHC) degradation.

5. The method of claim 1, wherein the electrical parameter is minimum operating voltage.

6. The method of claim 5, further comprising the step of comparing measured minimum operating voltages for the circuit after the DC stress period to a specified minimum operating voltage.

7. The method of claim 1, wherein the electrical parameter is maximum output frequency.

8. The method of claim 1, wherein the DC stress voltage is constant during the DC stress period.

9. The method of claim 1, further comprising the steps of holding and taking measurements for a number of stress cycles.

10. A method of testing an integrated circuit to determine the effect of negative bias temperature instability (NBTI) on minimum operating voltage, comprising the steps of:

applying a DC stress voltage at the voltage supply input of the circuit, the DC stress voltage being appropriate for inducing NBTI within the circuit;

holding all other circuit inputs and outputs at either ground or the DC stress voltage;

maintaining the DC stress voltage for a DC stress period;

after the DC stress period, taking measurements of the minimum operation voltage; and determining whether the minimum operating voltage exceeds a predetermined circuit specification for minimum operating voltage.

11. The method of claim 10, further comprising the step of applying heat to the circuit during the DC stress period.

12. The method of claim 10, further comprising the step of removing the DC stress voltage after the maintaining and measuring steps, and applying a clocked stress voltage to the circuit during a clocked stress period.

13. The method of claim 12, further comprising the step of isolating the effects of NBTI from the effects of channel hot carrier (CHC) degradation.

14. The method of claim 10, wherein the DC stress voltage is constant during the DC stress period.

15. The method of claim 10, further comprising the steps of holding and taking measurements for a number of stress cycles.

* * * * *